(12) United States Patent
Suzuki et al.

(10) Patent No.: US 6,770,370 B2
(45) Date of Patent: Aug. 3, 2004

(54) ADHESIVE COMPOSITION FOR SEMICONDUCTOR DEVICE AND ADHESIVE SHEET FOR SEMICONDUCTOR DEVICE USING THE SAME

(75) Inventors: Naoji Suzuki, Shizuoka (JP); Osamu Oka, Yaizu (JP); Jun Tochihira, Shimizu (JP); Akihiro Maeda, Shizuoka (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 51 days.

(21) Appl. No.: 10/211,265

(22) Filed: Aug. 5, 2002

(65) Prior Publication Data
US 2003/0111174 A1 Jun. 19, 2003

(30) Foreign Application Priority Data
Aug. 6, 2001 (JP) .................................. 2001-238175

(51) Int. Cl.$^7$ ............................................. B32B 27/38
(52) U.S. Cl. .......................... 428/413; 525/93; 525/98; 528/106; 528/123; 528/124
(58) Field of Search ............................ 428/413; 525/93, 525/98; 528/106, 123, 124

(56) References Cited

U.S. PATENT DOCUMENTS 5,160,783 A * 11/1992 Nemoto et al. ............... 442/67

* cited by examiner

Primary Examiner—Philip Tucker
Assistant Examiner—D. Aylward
(74) Attorney, Agent, or Firm—Nixon & Vanderhye P.C.

(57) ABSTRACT

An adhesive composition for semiconductor device, comprising 10 to 30% by weight of a reactive elastomer (A), 40 to 65% by weight of an epoxy resin (B) having two or more glycidyl ether groups, a phenol resin (C) and a curing accelerator (D), wherein a ratio of the epoxy resin (B) to the phenol resin (C) is within a range from 1:0.6 to 1:1 in terms of a functional group equivalent ratio, and an adhesive sheet for a semiconductor device using the same are provided. The composition and the sheet are superior in reflow resistance and short-time and low-temperature bonding without lowering characteristics such as heat resistance, low hygroscopicity, high adhesion and electrical insulating properties of an epoxy resin cured article.

10 Claims, 1 Drawing Sheet

ADHESIVE COMPOSITION FOR SEMICONDUCTOR DEVICE AND ADHESIVE SHEET FOR SEMICONDUCTOR DEVICE USING THE SAME

BACKGROUND OF THE INVENTION

1. Field of the Invention

The present invention relates to an adhesive composition for semiconductor devices suitable for mounting semiconductor chips or semiconductor elements on an interposer or a mother board, and an adhesive sheet for semiconductor devices manufactured by laminating the same.

2. Description of the Related Art

As the densities of integration in semiconductor chips increase, the semiconductor package has been evolving from a through hole mount type represented by DIP (Dual In-line Package) to a surface mount type such as QFP (Quad Flat Package), SOP (Small Outline Package) and TCP (Tape Carrier Package), with increasing numbers of pins and decreasing pitch sizes between pins. Along with these developments, the printed circuit board has also evolved from single sided mounting to allow double sided mounting, leading to a dramatic increase in the mounting density.

Moreover, further increases in the density of integration have been achieved by changing the arrangement of the leads of the package from peripheral arrangement to area array arrangement, represented by the BGA (Ball Grid Array) type and the CSP (Chip Scale Package), that has reduced the package size to as small as comparable to the chip size. In step with this evolution of the package for higher mounting density, semiconductor circuits have also been required to operate with ever increasing speeds. Server computers require particularly higher operating speed and higher mounting density.

In Western countries, in particular, higher operating speed has been regarded as the key to higher performance of electronic devices. Higher operating speed can be achieved by decreasing the length of interconnection between devices. With this regard, there has been much attention paid to the flip-chip mounting technology that is capable of making interconnection shorter than that in the CSP, and achieving lower cost through a reduction in the number of manufacturing processes.

In the typical mode of flip-chip mounting, chips are connected by soldering by means of solder bumps provided at the terminals of the chip. This mode has the drawback that stress is generated in the connection interface due to differences in the thermal expansion coefficient between the circuit board and the chip mounted thereon, thus leading to lower reliability of connection, depending on the operating conditions. For the purpose of reducing the stress in the connection interface, a technique has been studied in which the gap between the chip and the circuit board is filled with an underfill. But the filling process leads to disadvantages with regard to productivity and manufacturing cost, and involves the problem of life control required for the underfill which is in a liquid state.

In order to solve these problems, much development efforts are now being directed to a flip-chip mounting technique that uses a bonding material that has anisotropic electric conductivity and a sealing function. In an attempt to increase the operating speed by using this flip-chip mounting technique, a CSP package (flip-chip CSP) has been devised in which semiconductor chips are mounted on an interposer via a bonding material that has anisotropic electric conductivity and a sealing function, instead of the wire bonding connection technique that has been commonly employed. Another promising application of the bonding material described above is MCP (Multiple Chip Package) that incorporates a plurality of semiconductor bare chips or single chip packages which operate as if they were a single LSI.

Such semiconductor packages as CSP and MCP are mounted on a mother board by means of solder balls that are reflowed in an IR reflow furnace, similarly to the conventional packages. However, the use of solders that are free of lead, which has been increasing due to concern over environmental contamination, leads to higher melting temperatures for the solder, thus making it necessary to improve the heat resistance of the package. This trend also imposes the requirement for higher moist heat resistance on the bonding material used in the flip-chip mounting. This is required to prevent the popcorn phenomenon and delamination that occur when the water content contained in the bonding material is evaporated in the IR reflow process. For this purpose, semiconductor manufacturers have been taking such measures as humidity-proof packaging for product shipment, and device mounting plants have been adding processes in which the semiconductor devices are dried in an oven before the mounting process. But the additional cost of humidity-proof packaging and drying the semiconductor devices, and inconvenience in manufacturing operation caused by the need to remove the humidity-proof packaging present new problems to be solved.

From the view point of productivity, it is desired to carry out flip-chip bonding in a shorter period of time. In order to avoid the thermal influence on the semiconductor chip and the circuit board, it is desired to conduct thermocompression bonding at a lower temperature. However, no bonding material to be used in flip-chip mounting has been developed that satisfies the reflow resistance and short-time and low-temperature bonding. The present invention has been made to solve these problems.

BRIEF SUMMARY OF THE INVENTION

An object of the present invention is to provide a bonding material having excellent moist heat resistance, which prevents the popcorn phenomenon and delamination that occur when the water content contained in the bonding material is evaporated in the IR reflow process.

Another object of the present invention is to provide a bonding material which is superior in short-time and low-temperature bonding and is also superior in electrical insulating properties in consideration of connection to the surface to be wired.

The present invention provides an adhesive composition for a semiconductor device, comprising 10 to 30% by weight of a reactive elastomer (A), 40 to 65% by weight of an epoxy resin (B) having two or more glycidyl ether groups, a phenol resin (C) and a curing accelerator (D), wherein a ratio of the epoxy resin (B) to the phenol resin (C) is within a range from 1:0.6 to 1:1 in terms of a functional group equivalent ratio.

The present invention also provides an adhesive sheet for a semiconductor device comprising a layer made of the above adhesive composition for a semiconductor device.

The adhesive composition for the semiconductor device and the adhesive sheet for the semiconductor device of the present invention are preferably used in the flip-chip mounting of semiconductor bare chips.

DETAILED DESCRIPTION OF THE INVENTION

Figure 1:
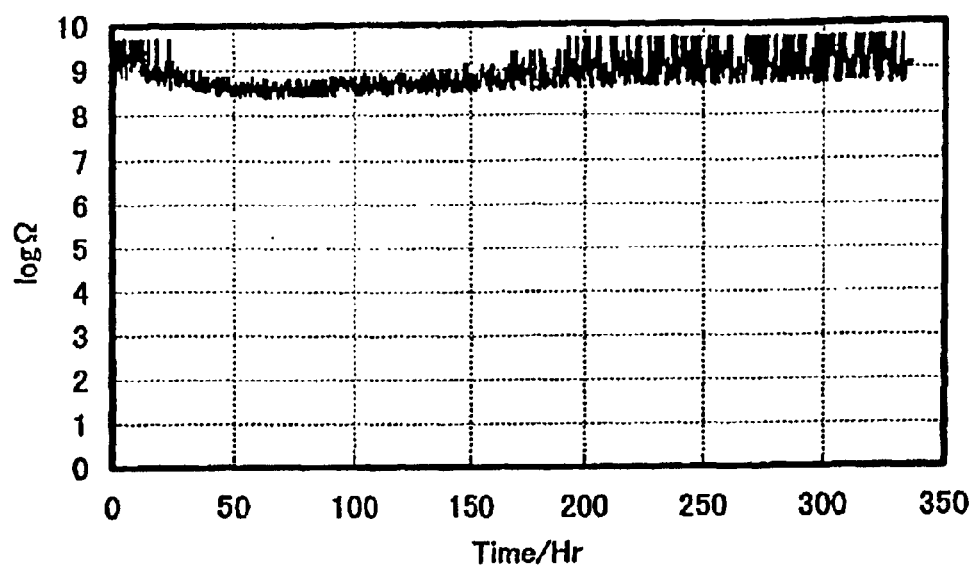
FIG. 1 is a graph showing a change in the insulation resistance value of Example 1.

The adhesive composition for semiconductor device of the present invention is an adhesive composition containing a reactive elastomer (A), an epoxy resin (B), a phenol resin (C) and a curing accelerator (D) as essential components.

The amounts (% by weight) of the reactive elastomer (A), the epoxy resin (B), the phenol resin (C) and the curing accelerator (D) in the present invention are amounts based on the total weight of components (A) to (D) contained in the adhesive composition for the semiconductor device, and other components are not contained.

The components (A) to (D) will now be described in detail.

The reactive elastomer (A) of the present invention is provided with reactivity by introducing a functional group into an elastomer.

This reactive elastomer is used for the purpose of imparting film-forming properties to an epoxy resin described hereinafter. The reactive elastomer (A) includes, for example, a rubber-modified aromatic polyamide obtained from a block copolymer of an aromatic polyamide having a hydroxyl group and a liquid rubber, or a copolymer of polyvinyl butyral and polystyrene.

The rubber-modified aromatic polyamide is obtained, for example, by dehydration condensation of 24.6 to 29.8% by weight of 3,4'-diaminophenyl ether, 2.8 to 3.5% by weight of 5-hydroxyisophthalic acid, 15.2 to 19.3% by weight of isophthalic acid and 47.4 to 57.4% by weight of an acrylonitrile-butadiene copolymer modified with carbonyls at both terminals.

Examples of the acrylonitrile-butadiene copolymer modified with carbonyl at both terminals include those (manufactured by Goodrich Co. under the trade name of Hycar CTBN1300×8) having an acrylonitrile content of 18% by weight and an average molecular weight of about 3600.

The rubber-modified aromatic polyamide obtained in the examples described above has a weight-average molecular weight of about 100,000, a viscosity of 0.4 to 0.6 dl/g and a hydroxyl group equivalent of 4880 to 6330. In the present invention, the rubber-modified aromatic polyamide preferably contains a liquid rubber in an amount within a range from 30 to 75% by weight, and more preferably from 45 to 60% by weight. An amount of less than 30% by weight is not preferred because brittleness appears when the adhesive sheet for a semiconductor device described hereinafter is in a semicured state. On the other hand, when the amount exceeds 75% by weight, the heat resistance and the toughness of the cured article of the adhesive sheet for the semiconductor device are likely to be degraded.

Examples of the reactive elastomer (A) of the present invention include a copolymer of a polyvinyl butyral having a carboxyl group in its molecule and polystyrene, in addition to a rubber-modified aromatic polyamide.

In the present invention, the copolymer of polyvinyl butyral and polystyrene preferably has an acid value within a range from 50 to 100 KOH-mg/g, and more preferably from 70 to 82 KOH-mg/g. An acid value of less than 50 KOH-mg/g is not preferred because the compatibility between the epoxy resin and the phenol resin, which are described hereinafter, is lowered. On the other hand, when the acid value exceeds 100 KOH-mg/g, unreacted carboxyl groups in the polyvinyl butyral remain after curing and are likely to exert an adverse influence on the hygroscopic resistance and electrical insulating properties of the cured article.

In the adhesive composition for a semiconductor device of the present invention, the amount of the reactive elastomer (A) is within a range from 10 to 30% by weight. When the amount of the reactive elastomer (A) is less than 10% by weight, brittleness appears when the adhesive sheet for a semiconductor device described hereinafter is in a semicured state. On the other hand, when the amount exceeds 30% by weight, it becomes impossible to sufficiently obtain properties specific to the epoxy resin, contained as an essential component, for example, heat resistance, low hygroscopicity, high adhesion and electrical insulating properties in cured article. Poor properties such as lack of heat resistance are likely to reduce the reliability of the adhesive for the semiconductor device.

As described above, since the reactive elastomer (A) is an essential component of the adhesive composition for a semiconductor device of the present invention and is an elastomer provided with reactivity, it improves the compatibility with other resins such as epoxy resin.

After curing, an increase in the thermal expansion coefficient of the entire system is suppressed by incorporating the elastomer. The suppression of the increase in the thermal expansion coefficient makes it possible to reduce the stress generated due to the difference in thermal expansion coefficient between the chip and the adhesive, and that between the adhesive and the circuit board.

The epoxy resin (B) of the present invention has two or more glycidyl ether groups its molecule.

An epoxy resin (B) having a glycidyl ester is liable to be hydrolyzed and, therefore, it is liable to cause delamination between the cured article and the adherend after a PCT (pressure cooker test). With regard to an epoxy resin having a glycidyl amine, since the glycidyl amine itself is likely to act as a catalyst, the stage B (semicured state) is difficult to control and storage stability is liable to be degraded. On the other hand, an epoxy resin having a linear aliphatic epoxide has poor reactivity because the linear aliphatic epoxide has a functional group on a principal chain. Therefore, of these epoxy resins, an epoxy resin having a glycidyl ether group is preferably used.

Particularly, most preferred is an epoxy resin wherein the glycidyl ether group is directly attached to the aromatic ring.

More specifically, of epoxy resins of this type, a dicyclopentadiene type epoxy resin, a biphenyl type epoxy resin, a naphthalene type epoxy resin, a cresol novolak type epoxy resin and a phenol novolak type epoxy resin are preferably used because the resulting cured article is superior in heat resistance, low hygroscopicity, high adhesion and electrical insulating properties. Specific examples thereof include dicyclopentadiene type epoxy resins manufactured by Dainippon Ink & Chemicals, Inc. under the trade name of EPICRON HP-7200 and EPICRON HP-7200H; biphenyl type epoxy resins manufactured by Yuka Shell Epoxy Co., Ltd. under the trade name of EPICOAT YX4000 and EPICOAT YX4000H; biphenyl novolak type epoxy resin manufactured by Nihon Kayaku Co. under the trade name of NC-3000P; naphthalene type epoxy resins manufactured by Dainippon Ink & Chemicals, Inc. under the trade name of EPICRON HP-4032 and EPICRON HP-4032P; cresol novolak type epoxy resins manufactured by Nihon Kayaku Co. under the trade name of EOCN-1020-55, EOCN-4500, EOCN-4600 and CER-1020; and brominated phenol novolak type epoxy resins manufactured by Nihon Kayaku Co. under the trade name of BREN-S, BREN-105 and BREN-304. Particularly, the brominated phenol novolak type epoxy resin is an effective means for imparting the flame resistance to the composition of the present invention, and is preferably used.

An amount of the epoxy resin (B) in the adhesive composition for the semiconductor device of the present invention is within a range from 40 to 65% by weight. When the amount is less than 40% by weight, properties peculiar to the epoxy resin, for example, heat resistance, low hygroscopicity, high adhesion and electrical insulating properties of the cured article are not obtained sufficiently and, therefore, the reliability of the adhesive composition for a semiconductor device is poor. On the other hand, when the amount exceeds 65% by weight, the adhesive sheet for semiconductor device in the physically semicured state becomes brittle and handling properties are poor.

As described above, when using the epoxy resin (B) as an essential component of the adhesive composition for a semiconductor device of the present invention, it is possible to obtain an adhesive composition for a semiconductor device and an adhesive sheet for a semiconductor device, which are superior in heat resistance, low hygroscopicity, high adhesion and electrical insulating properties.

The phenol resin (C) in the present invention reacts with the epoxy resin (B) to form a three-dimensional network structure.

Examples of the phenol resin (C) include phenol derivatives such as resol phenol resin, phenol novolak resin, cresol novolak resin, resorcinol resin and xylene resin. Among these resins, a phenol novolak resin is preferred because it is superior in reactivity and is particularly superior in moist heat resistance in purposes such as semiconductor device.

The phenol novolak resin used in the present invention preferably has a softening point within a range from 60 to 150° C., and particularly from 70 to 130° C., for the following reason. That is, when the softening point is lower than 60° C., the storage stability is poor. On the other hand, when the softening point exceeds 150° C., the reactivity is poor and the stage B (semicured state) is difficult to control.

A ratio of the epoxy resin (B) to the phenol resin (C) is within a range from 1:0.6 to 1:1 in terms of a functional group equivalent ratio, namely, an equivalent ratio of an epoxy group to a phenolic hydroxyl group. When the ratio of the phenol resin (C) is smaller than 1:0.6 in terms of the functional group equivalent ratio, a cured article having sufficient heat resistance and moisture resistance cannot be obtained. On the other hand, when the ratio of the phenol resin (C) is larger than 1:1 in terms of the functional group equivalent ratio, unreacted phenol resin (C) remains and is likely to exert an adverse influence on the hygroscopicity of the cured article.

As described above, when using the phenol resin (C) as an essential component of the adhesive composition for a semiconductor device of the present invention, it reacts with the epoxy resin (B), thereby making it possible to obtain an adhesive composition for a semiconductor device and an adhesive sheet for a semiconductor device, which are superior in moist heat resistance.

The curing accelerator (D) of the present invention preferably contains one or more kinds of basic catalyst.

The basic catalyst accelerates the reaction of the epoxy group originating in the epoxy resin (B) and the phenolic hydroxyl group originating in the phenol resin (C).

Examples of the basic catalyst include imidazole compounds, and an epoxy adduct type imidazole compound is preferably used.

Specifically, in an encapsulated basic catalyst containing an imidazole compound as a core component, 30 to 40% by weight of the imidazole compound is dispersed in a bisphenol F and/or A type liquid epoxy resin. This type has the merit of being capable of reconciling the stability of stage B (semicured state) at normal temperature and rapid curability at high temperature. Specific examples thereof include those manufactured by Asahi Kasei Epoxy Corp. under the trade name of NOVACURE HX-3921HP, NOVACURE HX-3941HP, NOVACURE HX-3721, NOVACURE HX-3748, NOVACURE HX-3741, NOVACURE HX-3088, NOVACURE HX-3722, NOVACURE HX-3742 and NOVACURE HX-3613.

Also the same effect as a curing accelerator can be obtained by dispersing an epoxy adduct type imidazole compound, which is not dispersed in a liquid epoxy resin, in the resin. This type has the merit that properties such as heat resistance, low hygroscopicity, high adhesion and electrical insulating properties in the epoxy resin cured article do not readily degrade because it is composed only of an imidazole compound and does not contain any other components.

Specific examples thereof include those manufactured by Ajinomoto-Fine-Techno Co., Inc. under the trade name of AMICURE PN-23, AMICURE PN-31, AMICURE PN-40 and AMICURE PN-H; and those manufactured by Asahi Denka Kogyo K.K. under the trade name of ADEKA HARDNER EH-3293.

Furthermore, an imidazole compound of a non-epoxy adduct type can be used similarly after dispersion in resin. Specific examples thereof include those manufactured by Shikoku Chemicals Corp. under the trade name of CURESOLAMZ-12, CURESOL AMZ-20, CURESOLAMZ-ADP, CURESOLAMZ-CN, CURESOLAMZ-CONH and CURESOL AMZ-CO.

It is a major premise that these curing accelerators do not dissolve in the solvent to be used during the preparation process. In this respect, tetrahydrofuran, methyl ethyl ketone, toluene or xylene are selected as the solvent.

The adhesive composition for a semiconductor device preferably contains the basic catalyst in an amount within a range from 3 to 16% by weight. When the amount of the basic catalyst is less than 3% by weight, a sufficient curing reaction rate cannot be obtained. On the other hand, when the amount exceeds 16% by weight, an adverse influence is likely to be exerted on the moisture resistance and electrical insulating properties of the cured article.

As described above, when using the curing accelerator (D) as an essential component of the adhesive composition for a semiconductor device of the present invention, the curing reaction of the adhesive composition for a semiconductor device of the present invention and the adhesive sheet for a semiconductor device occurs rapidly.

The adhesive composition for a semiconductor device of the present invention is prepared, for example, by dissolving the reactive elastomer (A), the epoxy resin (B) and the phenol resin (C) in each amount within the ranges described above in a solvent such as methyl ethyl ketone, tetrahydrofuran or toluene at a temperature within a range from normal temperature to about 50° C. After dissolution, the curing accelerator (D) is added and dispersed to obtain a coating composition of an adhesive composition for semiconductor device.

If necessary, a silane coupling agent, conductive particles and non-conductive particles described hereinafter can be added to the coating composition described above.

If necessary, the adhesive composition for a semiconductor device of the present invention contains a silane coupling agent, conductive particles and non-conductive particles, in addition to the reactive elastomer (A), the epoxy resin (B), the phenol resin (C) and the curing accelerator (D). These components will now be described in detail.

The silane coupling agent in the present invention is used to improve the compatibility between the resins and to enhance the adhesive strength to the adherend.

Examples of the silane coupling agent include epoxysilane-based compounds, aminosilane-based compounds and vinylsilane-based compounds. Among these compounds, an epoxysilane-based compound and an aminosilane-based compound are preferred because of the large effect on compatibility and adhesive strength. However, since the aminosilane-based compound is likely to degrade the storage stability of the adhesive composition for a semiconductor device and the adhesive sheet for a semiconductor device, an epoxysilane-based compound is most preferred.

When the function of anisotropic conductivity is imparted by the adhesive composition for a semiconductor device or the adhesive sheet for a semiconductor device of the present invention in flip-chip mounting, or the adhesive composition is used as a conductive adhesive in place of a solder, the adhesive composition for a semiconductor device may contain conductive particles. It is possible to use the adhesive for a semiconductor device for connection of electrodes when it contains conductive particles therein.

Examples of conductive particles which may be used in flip-chip mounting to impart the function of anisotropic conductivity include particles of metals such as gold, silver, copper, nickel and solder; and particles comprising a polymeric spherical core material such as polystyrene and a conductive layer made of gold or nickel provided on the surface of the core.

When using conductive particle-containing adhesive compositions for a semiconductor device in flip-chip mounting, interposition of conductive particles between the stud bump and the circuit electrode has the effect of absorbing dispersion in height of the stud bump. Absorption of the dispersion in the height of the stud bump has the merit that the accuracy of leveling is not required in the manufacture of the stud bump.

In case the stud bump varies in height, it is necessary that the average particle diameter of the conductive particles is larger than the dispersion in height. Furthermore, conductive particles having an average particle diameter smaller than the minimum distance between the stud bumps and the thickness of the adhesive sheet for semiconductor device are preferably used. The average particle diameter of the conductive particles is preferably within a range from 1 to 10 $\mu$m and the content thereof in the adhesive composition for a semiconductor device is preferably within a range from 5 to 35% by weight based on the total solid content.

When using these as the conductive adhesive in place of the solder, examples of the conductive particles are powders of metals such as gold, silver, copper, nickel and solder. Among these metal powders, gold, silver and copper powders having high conductivity are preferably used. Flaky metal powders are more preferred because the contact area between metal powders can be increased.

The content of conductive particles dispersed in the adhesive composition for a semiconductor device of the present invention is within a range from 60 to 90% by weight, and more preferably from 70 to 80% by weight, based on the total solid content. When the content of conductive particles is less than 60% by weight, sufficient conductivity can not be obtained. On the other hand, when the content exceeds 90% by weight, it is impossible to obtain sufficient adhesive strength. The average particle diameter of the conductive particles to be used as the conductive adhesive in place of the solder is preferably within a range from 5 to 20 $\mu$m.

In the present invention, non-conductive particles are preferably used to adjust the viscosity of the adhesive composition for semiconductor device, to adjust the thermal expansion coefficient, thermal conductivity or elastic modulus of the adhesive sheet for a semiconductor device, or to impart flame resistance.

Examples of the non-conductive particles include particles of ground silica, fused silica, alumina, titanium oxide, beryllium oxide, magnesium oxide, calcium carbonate, titanium nitride, silicon nitride, boron nitride, tungsten borate, silicon carbide, titanium carbide, zirconium carbide, molybdenum carbide, mica, zinc oxide, carbon black, aluminum hydroxide, calcium hydroxide, magnesium hydroxide, and those whose surface is treated with a trimethylsiloxyl group.

Also non-conductive particles having a thickness smaller than that of the adhesive sheet for a semiconductor device can be used.

When using the non-conductive particles in combination with the conductive particles, the particle diameter of the non-conductive particles is preferably smaller than that of the conductive particles in order to ensure conductivity.

As described above, the addition of the non-conductive particles has the effect of adjusting the viscosity of the adhesive composition for a semiconductor device and makes it possible to apply a coating composition on a support even if the coating solution has a low viscosity. In the adhesive sheet for a semiconductor device, the addition of non-conductive particles can reduce the stress due to differences in the thermal expansion coefficient, increase the thermal conductivity or enhance rapid curability. Also it has the effect of making it possible to adjust the elastic modulus. Since flame resistance is imparted by adding non-conductive particles, the resulting adhesive composition is preferably applied for purposes such as semiconductor devices.

The adhesive sheet for a semiconductor device of the present invention is obtained by laminating the adhesive composition for a semiconductor device on at least one surface of a support such as a releasing film, an insulating film or a release paper.

The film material used as the releasing film and the insulating film is preferably polyester (for example, polyethylene terephthalate), polyolefin (for example, polyethylene), polyimide, polyamide, polyether sulfone, polyphenylene sulfide, polyether ketone or triacetyl cellulose, and more preferably polyesters, polyolefins or polyimide.

As the releasing film, for example, there can be preferably used those obtained by subjecting a film made of these materials to a releasing treatment using a releasant such as silicone.

On one or both surfaces of these films, an adhesive coating composition prepared by dissolving and dispersing the adhesive composition for a semiconductor device of the present invention in an organic solvent is applied and dried to form an adhesive layer and, preferably, this adhesive layer is converted into a semicured state to suppress voids or fluidity during the thermocompression bonding.

To suppress the flowability or expansion by the processing conditions, for example, reduction of the curing time or embedding into the conductor pattern, the semicured state is appropriately controlled. The method of controlling the semicured state is not specifically limited, but the semicured state is preferably controlled by aging.

The thickness after drying the adhesive layer is within a range from 3 to 200 μm, and preferably from 5 to 100 μm.

During the storage of the film with the adhesive layer formed thereon, a protective film may be applied thereto if necessary, and the protective film is peeled off immediately before use.

The adhesive composition for a semiconductor device and the adhesive sheet for a semiconductor device of the present invention can be used in various electronic parts, but are particularly suited for use in flip-chip mounting of semiconductor bare chips on an interposer because of their excellent hygroscopic resistance and IR reflow resistance. The adhesive composition for a semiconductor device and the adhesive sheet for a semiconductor device are also useful as an underfill material for the purpose of reducing the stress that is generated in the connection interface, at the solder ball portion where the package is bonded to the mother board in BGA, CSP and MCP, due to the difference in thermal expansion coefficient between the circuit board and the chip mounted thereon.

Furthermore, the adhesive composition for a semiconductor device and the adhesive sheet for a semiconductor device can also be used as a sealing resin or a sealing sheet, which protect semiconductor chips from the exterior environment, and can also be used as a conductive adhesive in place of the solder by filling with a large amount of conductive particles.

As described above, a semiconductor device having high reliability can be obtained by using the adhesive composition for semiconductor device and the adhesive sheet for semiconductor device.

EXAMPLES

The following Examples further illustrate the present invention in detail, but the present invention is not limited thereto.

Preparation of Coating Composition of Adhesive Composition:

A reactive elastomer (A), an epoxy resin (B) and a phenol resin (C) shown in Table 1 were dissolved in methyl ethyl ketone at a temperature within a range from normal temperature to about 50° C. so that each amount is the % by weight (solid content) shown in Table 2. Then, a curing accelerator (D) was dispersed so that the amount becomes the % by weight (solid content) shown in Table 2 to prepare a solution.

If necessary, a silane coupling agent (E), conductive particles (F) and non-conductive particles (G) were mixed so that each amount becomes the % by weight (solid content) shown in Table 2 based on the total essential components of the reactive elastomer (A), the epoxy resin (B), the phenol resin (C) and the curing accelerator (D).

Then, the solution was prepared so that the solid content of the total essential components of the reactive elastomer (A), the epoxy resin (B), the phenol resin (C) and the curing accelerator (D) becomes a value within a range from 40 to 50% by weight to obtain a coating composition of an adhesive composition for a semiconductor device.

TABLE 1

| Name of compound material | Kind | Contents |
|---|---|---|
| Reactive elastomer (A) | A-1 | Rubber-modified aromatic amide (manufactured by Tomoegawa Paper Co., Ltd. under the trade name of BPAM-02) |
|  | A-2 | Polyvinyl butyral-polystyrene copolymer (manufactured by Mitsubishi Chemical Corp. under the trade name of EPOLYNER-1210) |
| Epoxy resin (B) | B-1 | Cresol novolak type epoxy resin (manufactured by Nihon Kayaku Co. under the trade name of EOCN-4500) |
|  | B-2 | Biphenyl type epoxy resin (manufactured by Yuka Shell Epoxy Co., Ltd. under the trade name of EPICOAT YX4000H |
|  | B-3 | Dicyclo type epoxy resin (manufactured by Dainippon Ink & Chemicals, Inc. under the trade name of EPICRON HP-7200H) |
|  | B-4 | Naphthalene type epoxy resin (manufactured by Dainippon Ink & Chemicals, Inc. under the trade name of EPICRON HP-4032D) |
|  | B-5 | Dimer acid diglycidyl ester (manufactured by Toto Chemical Industry, Ltd. under the trade name of EPOTOTO YD-171) |
| Phenol resin (C) | C-1 | Novolak type phenol resin (manufactured by Showa Highpolymer Co., Ltd. under the trade name of SHOWNOL BRG-555) |
|  | C-2 | Novolak type phenol resin (manufactured by Showa Highpolymer Co., Ltd. under the trade name of SHOWNOL CKM-2400) |
|  | C-3 | Novolak type phenol resin (manufactured by Gunei Chemical Industry Co., Ltd. under the trade name of RESITOP GPS-080) |
| Curing accelerator (D) | D-1 | Epoxy adduct type imidazole compound (manufactured by Asahi Kasei Epoxy Corporation. under the trade name of NOVACURE HX-3088) |
|  | D-2 | Epoxy adduct type imidazole compound (manufactured by Ajinomoto-Fine-Techno Co., Inc. under the trade name of AMICURE PN-23) |
|  | D-3 | Imidazole compound (manufactured by Shikoku Chemicals Corp. under the trade name of CURESOL AMZ-20) |
| Silane coupling agent | E-1 | Epoxy-based silane coupling agent (manufactured by Shin-Etsu Chemical Industries Co., Ltd. under the trade name of KBM403) |
| Conductive particles | F-1 | Nickel particles having an average particle diameter of 3 to 7 μm (manufactured by INCO Co. under the trade name of TYPE 123 NICKEL POWDER) |
| Non-conductive particles | G-1 | High-purity alumina having an average particle diameter of 0.4 μm (manufactured by Showa Denko K. K. under the trade name of UA-5105) |

TABLE 2

| Raw material No. | A-1 | A-2 | B-1 | B-2 | B-3 | B-4 | B-5 | C-1 | C-2 | C-3 | D-1 | D-2 | D-3 | E-1 | F-1 | G-1 | Functional group equivalent ratio of epoxy resin (B) to phenol resin (C) |
|---|---|---|---|---|---|---|---|---|---|---|---|---|---|---|---|---|---|
| Example 1 | 15 | | 42 | | | | | | | 19 | 24 | | | | | | 1:0.90 |
| Example 2 | 30 | | 49 | | | | | | | 18 | | 3 | | | | | 1:0.73 |
| Example 3 | | 15 | | 42 | | | | 19 | | | 24 | | | | | | 1:0.84 |
| Example 4 | | 30 | | 49 | | | | 18 | | | | 3 | | | | | 1:0.68 |
| Example 5 | 15 | | 63 | | | | | | | 19 | | 3 | | | | | 1:0.60 |
| Example 6 | | 18 | | | 58 | | | 21 | | | | | 3 | | | | 1:0.99 |
| Example 7 | | 14 | | | | 44 | | 14 | | | 21 | | 7 | | | | 1:0.87 |
| Example 8 | 14 | | | | | 42 | | | 40 | | | | 4 | 1 | | | 1:0.90 |
| Example 9 | 14 | | | | | 42 | | | 40 | | | | 4 | | 25 | | 1:0.90 |
| Example 10 | 14 | | | | | 42 | | | 40 | | | | 4 | | | 40 | 1:0.90 |
| Comparative Example 1 | 35 | | 44 | | | | | | | 18 | | 3 | | | | | 1:0.81 |
| Comparative Example 2 | 20 | | | | | | 57 | | 18 | | | 5 | | | | | 1:0.90 |
| Comparative Example 3 | | 28 | | 35 | | | | | 18 | | 19 | | | | | | 1:0.95 |
| Comparative Example 4 | 20 | | | | | 48 | | | 28 | | | | 4 | | | | 1:0.55 |
| Comparative Example 5 | | 20 | | | 55 | | | 22 | | | | | 3 | | | | 1:1.10 |

Evaluation Procedure (Evaluation of Electrical Characteristics):

A test comb-shaped circuit having a distance between conductors of 50 μm/50 μm was manufactured by thermally compress-bonding a photoresist film on a flexible substrate (manufactured by Nippon Steel Chemical Co., Ltd. under the trade name of ESPANEX), followed by exposure, etching and stripping of the resist film.

Then, each of the coating compositions of the adhesive composition for a semiconductor device of Examples 1 to 10 and Comparative Examples 1 to 5 was applied on a 38 μm thick polyester film subjected to a releasing treatment so that the thickness after drying became 25 μm and, after drying in a hot air circulation type drying machine at 100° C. for 3 minutes, a 38 μm thick polyester film subjected to a releasing treatment was laminated thereon to manufacture an adhesive sheet for a semiconductor device which is used for measurement of an insulating resistance value. Subsequently, an adhesive sheet for a semiconductor device, a polyester protective film formed on one surface thereof had been peeled off, was temporarily compress-bonded on the circuit at a temperature within a range from 80 to 120° C., and another polyester film was peeled off. Then, the circuit was heated to 180° C. for 10 minutes while applying pressure using a vacuum press (Model: KVHC, manufactured by KITAGAWA SEIKI Co., Ltd.) and the adhesive layer made of the adhesive composition for semiconductor device was cured to obtain a sample for evaluation of electrical characteristics.

Figure 2:
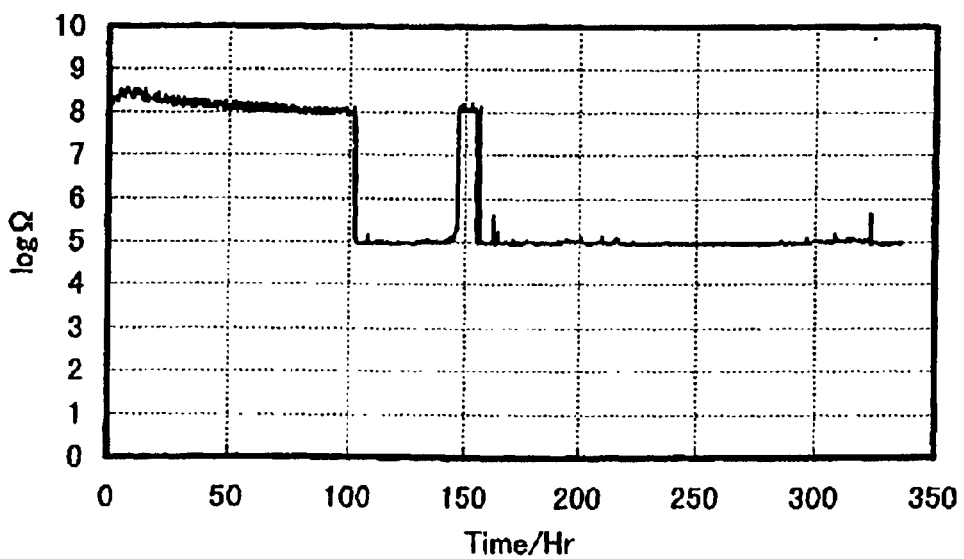
FIG. 2 is a graph showing a change in the insulation resistance value of Comparative Example 1.

This sample for evaluation was put in a thermostatic bath and an insulating resistance value was measured by applying a voltage. This test was conducted under the conditions of a temperature of 130° C., a humidity of 85% RH, an applied voltage (DC voltage) of 5V, and a voltage application time of 336 hours. Furthermore, the presence or absence of electrolytic corrosion in the comb-shaped circuit to the conductor (copper foil portion) was confirmed. The results represented by "number of samples rated good/total number of samples" are shown in Table 3, together with the presence or absence of deterioration of the insulating resistance value. Examples of changes in the insulation resistance values of Example 1 and Comparative Example 1 are shown in FIG. 1 and FIG. 2.

Evaluation of Reflow Resistance:

Each of the coating compositions of the adhesive composition for a semiconductor device of Examples 1 to 10 and Comparative Examples 1 to 5 was applied on a 38 μm thick polyester film subjected to a releasing treatment so that the thickness after drying became 25 μm, followed by drying in a hot air circulation type drying machine at 100° C. for 3 minutes to manufacture an adhesive sheet for a semiconductor device. Then, a 38 μm thick polyester film subjected to a releasing treatment was laminated thereon. Subsequently, the protective polyester film was peeled off and 25 μm thick adhesive sheets for a semiconductor device were laminated with each other at a temperature within a range from 60 to 100° C. to obtain a 50 μm thick adhesive sheet for semiconductor film. To suppress the flowability or expansion, the semicured state was controlled under proper aging conditions.

After cutting the adhesive sheet for a semiconductor device thus obtained into a size of 0.9 cm×0.7 cm, a protective polyester film formed on one surface was peeled off and the cut adhesive sheet was temporarily press-bonded on a glass epoxy substrate (manufactured by Mitsubishi Gas Chemical Co., Inc. under the trade name of CCL-EL170), wherein a copper portion of a thickness of 200 μm and a size of 2.0 cm×2.0 cm was etched, at a temperature within a range from 90 to 130° C. Furthermore, another polyester film was peeled off and a glass chip in the size of 0.9 cm×0.7 cm was primarily compress-bonded to the adhesive at a temperature within a range from 180 to 220° C. for 5 to 20 seconds under a pressure of 1 MPa. In some cases, the adhesive layer was cured by heating at a temperature within a range from 150 to 180° C. for 10 to 30 minutes after thermocompression bonding to obtain samples for evaluation of the reflow resistance.

The samples for evaluation were exposed in a thermostatic bath under the conditions of a temperature of 85° C. and a humidity of 85% RH for 168 hours and passed once through an IR reflow oven set to 260° C., and then the presence or absence of delamination and expansion was observed. The results represented by "number of samples rated good/total number of samples" are shown in Table 3.

TABLE 3

| No. | Evaluation | |
| --- | --- | --- |
| | Electrical characteristics | Reflow resistance |
| Example 1 | 5/5 | 5/5 |
| Example 2 | 5/5 | 5/5 |
| Example 3 | 5/5 | 5/5 |
| Example 4 | 5/5 | 5/5 |
| Example 5 | 5/5 | 5/5 |
| Example 6 | 5/5 | 5/5 |
| Example 7 | 5/5 | 5/5 |
| Example 8 | 5/5 | 5/5 |
| Example 9 | 5/5 | 5/5 |
| Example 10 | 5/5 | 5/5 |
| Comparative Example 1 | 0/5 | 0/5 |
| Comparative Example 2 | 0/5 | 0/5 |
| Comparative Example 3 | 0/5 | 0/5 |
| Comparative Example 4 | 0/5 | 0/5 |
| Comparative Example 5 | 0/5 | 0/5 |

In Comparative Example 1, the content of the reactive elastomer exceeds the upper limit of the reactive elastomer (A) in the present invention, while the epoxy resin used in Comparative Example 2 is different from the epoxy resin (B) in the present invention. In Comparative Example 3, the content of the epoxy resin is lower than the lower limit of the content of the epoxy resin (B) in the present invention. In Comparative Examples 4 and 5, the functional group equivalent of the epoxy resin (B) to the phenol resin (C) deviates from the range of the functional group equivalent in the present invention.

As is apparent from the results shown in Table 3, the coating compositions obtained in Comparative Examples 1 to 5 were unsatisfactory in electrical characteristics and reflow resistance. On the other hand, the coating compositions obtained in Examples 1 to 10 were markedly superior in electrical characteristics and reflow resistance.

As described above, according to the present invention, it is possible to obtain an adhesive composition for a semiconductor device and an adhesive sheet for a semiconductor device, which are superior in reflow resistance and short-time and low-temperature bonding without lowering characteristics such as heat resistance, low hygroscopicity, high adhesion and electrical insulating properties of an epoxy resin cured article to the utmost by mixing a necessary minimum amount of a reactive elastomer. Furthermore, the use of the adhesive composition for a semiconductor device and the adhesive sheet for a semiconductor device make it possible to obtain a high reliability semiconductor device which does not cause reflow cracks during the solder reflow process, which is industrially advantageous.

What is claimed is:

1. An adhesive composition for a semiconductor device, comprising 10 to 30% by weight of a reactive elastomer (A), 40 to 65% by weight of an epoxy resin (B) having two or more glycidyl ether groups, a phenol resin (C) and a curing accelerator (D), wherein a ratio of the epoxy resin (B) to the phenol resin (C) is within a range from 1:0.6 to 1:1 in terms of a functional group equivalent ratio.

2. The adhesive composition for a semiconductor device according to claim 1, wherein the reactive elastomer (A) is a block copolymer of an aromatic polyamide having a hydroxyl group and a liquid rubber and an amount of the liquid rubber in the copolymer is within a range from 30 to 75% by weight.

3. The adhesive composition for a semiconductor device according to claim 1, wherein the reactive elastomer (A) is a copolymer of at least polyvinyl butyral and polystyrene and an acid value of the copolymer is within a range from 50 to 100 KOH-mg/g.

4. The adhesive composition for semiconductor device according to claim 1, wherein the curing accelerator (D) contains one or more kinds of basic catalysts and an amount of the basic catalysts in the adhesive composition for a semiconductor device is within a range from 3 to 16% by weight.

5. The adhesive composition for a semiconductor device according to claim 1, which further contains a silane coupling agent.

6. The adhesive composition for a semiconductor device according to claim 1, which further contains conductive particles.

7. The adhesive composition for semiconductor device according to claim 1, which further contains non-conductive particles.

8. An adhesive sheet for semiconductor device comprising a layer made of the adhesive composition for a semiconductor device of claim 1.

9. The adhesive composition for a semiconductor device according to claim 1, which is used in flip-chip mounting of semiconductor bare chips.

10. The adhesive sheet for a semiconductor device according to claim 8, which is used in flip-chip mounting of semiconductor bare chips.

* * * * *